United States Patent [19]

Kasper et al.

[11] Patent Number: 5,003,364

[45] Date of Patent: Mar. 26, 1991

[54] DETECTOR HAVING A RADIATION SENSITIVE SURFACE

[75] Inventors: Erich Kasper, Pfaffenhofen; Gerhard Kohlbacher, Ulm; Peter Nothaft, Neu-Ulm/Reutti, all of Fed. Rep. of Germany

[73] Assignee: Licentia Patent-Verwaltungs-GmbH, Frankfurt, Fed. Rep. of Germany

[21] Appl. No.: 70,572

[22] Filed: Jul. 7, 1987

[30] Foreign Application Priority Data

Jul. 8, 1986 [DE] Fed. Rep. of Germany ....... 3622879

[51] Int. Cl.⁵ .................... H01L 27/14; H01L 27/12; H01L 29/161
[52] U.S. Cl. .......................................... 357/30; 357/4; 357/16; 357/24; 357/58; 357/61
[58] Field of Search ............ 357/24 L R, 30 D, 30 G, 357/30 H, 30 L, 30 N, 30 Q, 30 R, 4, 16, 58, 61

[56] References Cited

U.S. PATENT DOCUMENTS

| | | | |
|---|---|---|---|
| 4,190,851 | 2/1980 | Finnila et al. | 357/24 LR |
| 4,198,646 | 4/1980 | Alexander et al. | 357/30 D |
| 4,257,057 | 3/1981 | Cheung et al. | 357/24 LR |
| 4,276,099 | 6/1981 | Keen et al. | 357/24 LR |
| 4,313,127 | 1/1982 | Su et al. | 357/24 LR |
| 4,553,152 | 11/1985 | Nishitani | 357/30 B |
| 4,661,168 | 4/1987 | Maier et al. | 357/24 LR |

OTHER PUBLICATIONS

Luryi et al., "New Infrared Detector on a Silicon Chip", *IEEE Transactions on Electron Devices*, vol. ED-31, No. 9, Sep. 1984.

*Primary Examiner*—Andrew J. James
*Assistant Examiner*—Ngan Van Ngo
*Attorney, Agent, or Firm*—McGlew & Tuttle

[57] ABSTRACT

The invention relates to CCD Si detector configuration with a semiconductor sensibilizator. The spectral range of the detectors extends from 0.4 μm to 1.6 μm. The CCD Si detector configuration is produced as integrated structure so that a large picture element number can be achieved. The semiconductor layer sequence of the semiconductor sensibilizator is grown using differential molecular beam epitaxial growth techniques.

11 Claims, 2 Drawing Sheets

DETECTOR HAVING A RADIATION SENSITIVE SURFACE

BACKGROUND OF THE INVENTION

Field of the Invention

This invention relates in general to a detector configuration and in particular to a new and useful CCD Si detector configuration with a semiconductor sensibilizator.

Some of the areas in which detector configurations with charge-coupled read-out are employed are sensory analysis, picture recording and space exploration among others. It is desirable that these charge coupled devices, also called CCDs, are laid out for as wide a spectral range as possible and permit as large a picture element number as possible. Large picture element numbers are achieved by the use of monolithic integrated detector configurations. Such monolithic integrated CCD detector configurations on a Si-substrate are already used in a multitude of ways (see, for example, German Patent 24 02 654).

The Si-CCD detector configurations, however, have the disadvantage that their spectral range extends only to approximately 1 μm and thus only a small segment of the infrared (IR) spectrum is detected. IR-detectors, which are sensitive to radiation having as upper limit wave length $\lambda = 1.6$ μm are produced from the semiconductor materials Si and Ge. Si-Ge detectors without CCD readout are known from the publication by S. Luryi et al, IEEE-Electron Devices 31, 1135 (1984).

SUMMARY OF THE INVENTION

The invention is based on the task of making a CCD-Si detector configuration of this kind, which has a large picture element number and a spectral range of 0.4 μm to 1.6 μm and can be produced cost-effective.

In accordance with the invention, a detector configuration with at least one radiation-sensitive surface and at least one charge coupled device which is arranged on a monocrystalline silicon substrate comprises a radiation-sensitive surface with a semiconductor sensibilizator on said radiation-sensitive surface, said sensibilizator having an energy band structure which is at least suitable for the spectral range from 0.4 μm to 1.6 μm and at least one layer is opaque to radiation and is available such that solely the semiconductor sensibilizator is accessible to the radiation to be detected.

The CCD-Si detector configuration with a semiconductor sensibilizator has the advantage that through the differing energy gaps of the various semiconductor materials of the sensibilizator a given spectral range of the detector can be set. A further advantage is that through the integrated design of the CCD-Si detector configuration and by growing the semiconductor layers of the corresponding sensibilizator with differential molecular beam epitaxial growth techniques a module in the order of 10 μm can be obtained and the picture element number increased into the mega range.

Accordingly, it is an object of the invention to provide a CCD-Si detector configuration with a semiconductor sensitive stabilizator.

A further object of the invention is to provide a CCD-Si detector having a spectral range of the range from 0.4 μm to 1.6 μm configuration produced as an integrated structure so that a large picture element number can be achieved.

A further object of the invention is to provide a CCD-Si detector configuration which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

GENERAL DESCRIPTION OF THE PREFERRED EMBODIMENTS

Figure 1:
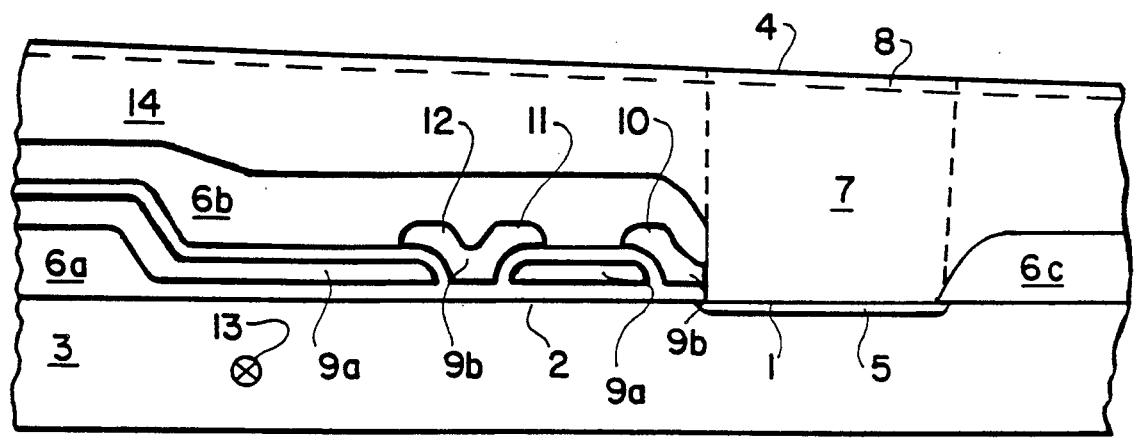
FIG. 1 is a sectional view of the semiconductor layers grown on the CCD-Si detector configuration through differential molecular beam epitaxial growth techniques (MBE)

Referring to the drawings, in particular, the invention embodied therein comprises a detector configuration with at least one radiation-sensitive surface 1 having at least one charge coupled device 2 which is arranged on a monocrystalline silicon substrate 3. The semiconductor sensibilizator 4 is located on the radiation-sensitive surface 1 which has an energy band structure which is at least suitable for the spectral range of from 0.4 μm to 1.6 μm. At least one layer opaque to radiation is available such that only the semiconductor sensibilizator 4 is accessible to the radiation to be detected.

According to FIG. 1 several oxide layers 6a, 6b, 6c, and polycrystalline Si-layers 9a, 9b are applied on a Si substrate 3 and form together with the corresponding input storage and transition electrodes 10, 11, 12, as well as tunneling 13 a known CCD. The input electrode 10 of the CCD adjoins the detector contact layer 5, which is generated for example by as diffusion and which has a charge carrier concentration of approximately $10^{20}$ per cm$^3$ and a layer thickness of approximately 3 μm. By coupling detector and CCD the charge packet of the optically generated minority carrier can be read out over the storage electrode 12 at a clock frequency to be determined. Since the CCD has tunneling 13 the charge packet can be displaced below the substrate surface. The i type Ge and p type Ge semiconductor layers 7 respectively 8 are grown on using differential molecular beam epitaxial growth techniques (MBE) at a temperature of 375° C. and a growth rate of 0.5 nm per second. The layer thickness of the i type Ge semiconductor is 3 μm, that of the p type Ge semiconductor layer 0.1 μm at a doping material concentration of approximately $10^{19}$ charge carriers per cm$^3$. As doping substances boron or gallium are preferentially used. The thickness of the uppermost semiconductor layer, in our embodiment the p type Ge semiconductor layer is less than the penetration depth of the radiation and the radiation is not completely absorbed.

Figure 2:
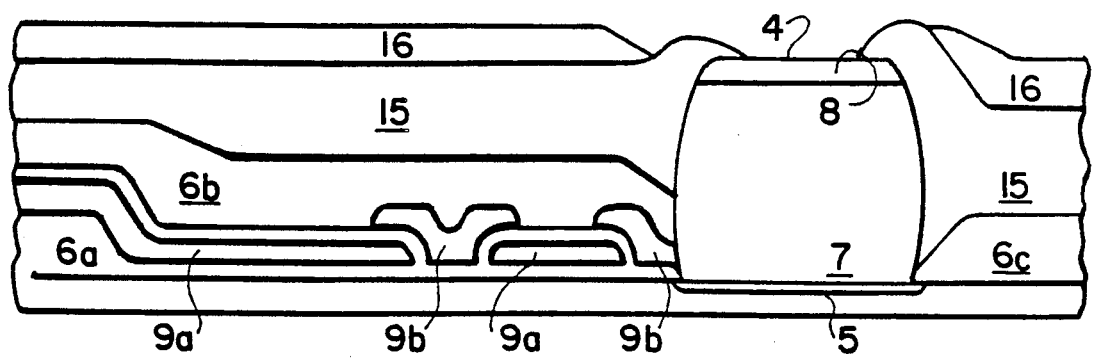
FIG. 2 is a similar view showing the etching, passivation and metallizing steps which are needed for manufacturing the detector configuration according to the principle of the invention.

The differential MBE process has the advantage that a precisely determinable transition between poly- and monocrystalline Ge material originates: on the detector contact layer 5 monocrystalline i type Ge and p type Ge layers 7, 8, on the oxide layer 6b a polycrystalline Ge layer 14 originate. This polycrystalline Ge layer 14 is removed in an etching process customary in semiconductor technology. To protect against the incident radiation a passivation and a metal layer 15, 16 are applied (FIG. 2). Only the area of the monocrystalline semiconductor sensibilizator 4 remains permeable to the radiation.

The semiconductor materials Si and Ge have different gaps between conducting and valence band. A Si detector has an energy gap of wave length $\lambda = 1.1$ $\mu$m. The Si detector with Ge sensibilizator 4 has an energy gap of $\lambda = 1.6$ $\mu$m displaced toward longer wave lengths. The Si-Ge detector therefore has a wider spectral range than a Si detector.

The semiconductor sensibilizator 4 can, for example, be built up of a semiconductor layer sequence, which contains at least one Si/SiGe superlattice. A Si-SiGe superlattice is described in the unpublished German patent application P 35 27 363.1. A semi-conductor sensibilizator having a si/si/GE-superlattice are known from German patent application DE OS 35 27 363.

The energy gaps in the superlattice can be selectively and precisely set. The spectral range of the detector can in this way be enlarged further ($\lambda > 1.6$ $\mu$m).

For the semiconductor sensibilizator III/V semiconductor materials or CdHgTe or PbSnTe can also be used. By using molecular beam epitaxial growth techniques it becomes possible to grow semiconductor materials with different lattice constants on a Si-substrate.

Figure 3:
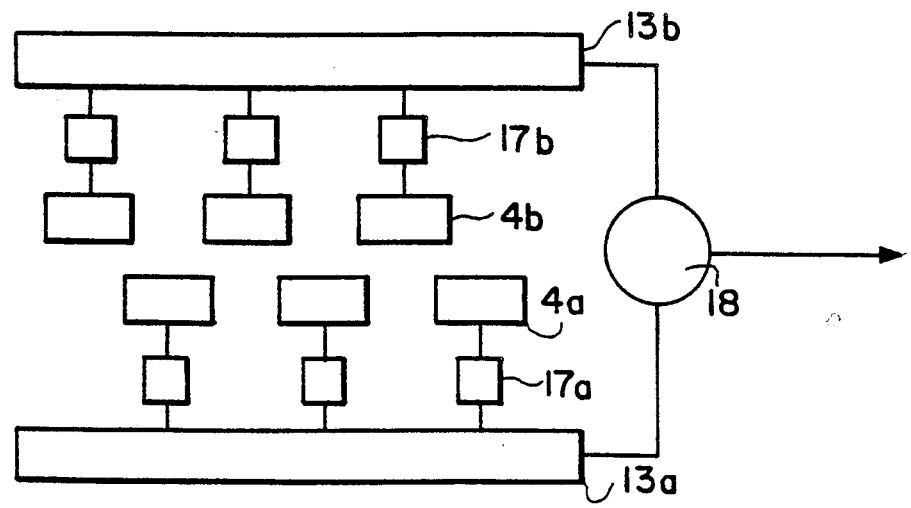
FIG. 3 is a possible geometric configuration of two CCDs and several detectors with semiconductor sensibilizators.
Figure 4:
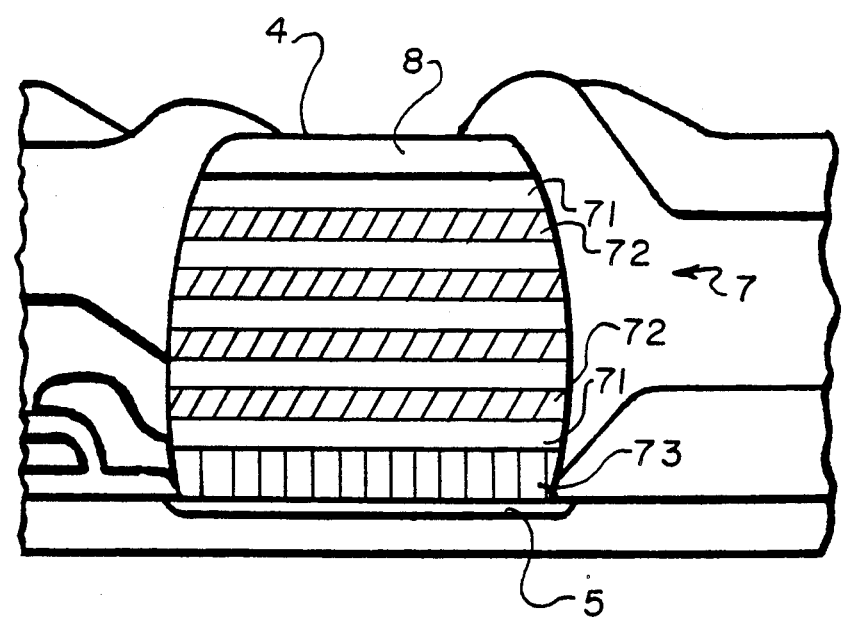
FIG. 4 is a schematic sectional view of another example of sensibilizator.

In FIG. 3, for example, two CCDs with corresponding Ge sensibilizators 4a, 4b, are arranged staggered on a Si-substrate. The configuration has two CCD tunnels 13a, 13b, which, according to the principle of the invention, are connected via a CCD detector coupling structure 17a, 17b with the Ge sensibilizators 4a, 4b. In this embodiment the pulse sequences of the CCD-Si detectors are phase displaced by 180°. The output signals of the two CCDs are transmitted further via a multiplexer 18 with the vacant signals of the CCD interstages being replaced by the signal information of the opposing CCD chain. The output signal appears with the same frequency with which the two CCDs are read out also.

While specific embodiments of the invention have been shown and described in detail to illustrate the application of the principles of the invention, it will be understood that the invention may be embodied otherwise without departing from such principles.

What is claimed is:

1. A detector configuration with at least one radiation-sensitive surface and at least one charge coupled device which is arranged on a monocrystalline silicon substrate, comprising a radiation sensitive surface, a semiconductor sensibilizator located on said radiation-sensitive surface having an energy band structure which is at least suitable for the spectral range of 0.4 $\mu$m and to 1.6 $\mu$m, and at least one layer is opaque to radiation which is available such that solely the semiconductor sensibilizator is accessible to the radiation to be detected.

2. A detector configuration according to claim 1, wherein said radiation-sensitive surface comprises a detector contact layer and a silicon substrate into which said detector contact layer is diffused.

3. A detector configuration according to claim 1, wherein said semiconductor sensibilizator is built up of an undoped monocrystalline semiconductor layer and an uppermost p-doped monocrystalline semiconductor layer.

4. A detector configuration according to claim 3, wherein said uppermost monocrystalline semiconductor layer has a thickness selected corresponding to the radiation to be detected and is of a thickness which must be smaller than the penetration depth of the radiation.

5. A detector configuration according to claim 3, wherein said semi-conductive sensibilizator comprises an arsenic diffusion material and wherein said monocrystalline semiconductor-layers of the semiconductor sensibilizator comprises an i type germanium and p type germanium.

6. A detector configuration according to claim 1, wherein said semiconductor sensibilizator comprises a semiconductor layer sequence which contains at least one semiconductor superlattice.

7. A detector configuration according to claim 6, wherein said semiconductor sensibilizator is built up of a superlattice with a semiconductor layer sequence Si and Si-Ge semiconductor layers.

8. A detector configuration as stated in claim 1 wherein said semiconductor sensibilizator is constructed of III/V semiconductor materials.

9. A detector configuration according to claim 1, wherein said semiconductor sensibilizator is built up of a semiconductor materials CdHgTe or PbSnTe.

10. A detector configuration according to claim 1, wherein said layer which is opaque to radiation comprises a metal layer and a passivation layer on which said metal layer is positioned.

11. A detector configuration according to claim 3, wherein said semiconductor layers of said semiconductor sensibilizator comprises a differential molecular beam epitaxial growth.

* * * * *